United States Patent
Noguchi et al.

(10) Patent No.: US 8,373,629 B2
(45) Date of Patent: Feb. 12, 2013

(54) DISPLAY DEVICE

(75) Inventors: Yukihiro Noguchi, Gifu (JP); Yoshiyuki Ishizuka, Inazawa (JP); Shinichi Takatsuka, Nagoya (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 676 days.

(21) Appl. No.: 11/392,626

(22) Filed: Mar. 30, 2006

(65) Prior Publication Data

US 2006/0221092 A1    Oct. 5, 2006

(30) Foreign Application Priority Data

Mar. 30, 2005  (JP) ................................ 2005-099932
Aug. 31, 2005  (JP) ................................ 2005-252699

(51) Int. Cl.
  *G09G 3/32*      (2006.01)
(52) U.S. Cl. .................... 345/83; 345/76; 315/169.3
(58) Field of Classification Search .............. 345/76, 345/83; 315/169.3
  See application file for complete search history.

(56) References Cited

U.S. PATENT DOCUMENTS

| | | | |
|---|---|---|---|
| 6,366,025 B1* | 4/2002 | Yamada | 315/169.3 |
| 6,771,028 B1* | 8/2004 | Winters | 315/169.1 |
| 6,909,233 B2* | 6/2005 | Cok et al. | 313/506 |
| 6,987,355 B2* | 1/2006 | Cok | 313/506 |
| 7,012,588 B2* | 3/2006 | Siwinski | 345/83 |
| 2002/0024618 A1* | 2/2002 | Imai | 348/743 |
| 2002/0186214 A1 | 12/2002 | Siwinski | |
| 2004/0201558 A1* | 10/2004 | Arnold et al. | 345/83 |
| 2004/0251821 A1* | 12/2004 | Cok | 313/506 |
| 2006/0146067 A1* | 7/2006 | Schweng et al. | 345/591 |
| 2006/0197458 A1* | 9/2006 | Winters et al. | 315/169.1 |

FOREIGN PATENT DOCUMENTS

| | | |
|---|---|---|
| CN | 1551079 | 12/2004 |
| JP | 2000330522 | 11/2000 |
| JP | 2001-290441 | 10/2001 |
| JP | 2002221917 | 8/2002 |
| JP | 2004-334204 | 11/2004 |
| JP | 2004311440 | 11/2004 |
| JP | 2004334204 | 11/2004 |
| JP | 2004335467 | 11/2004 |
| WO | 2007050113 | 5/2007 |

OTHER PUBLICATIONS

Official Action in corresponding Japanese application, dated Aug. 4, 2009.
Official Action in corresponding Japanese application, dated Feb. 16, 2010.
Official Action in corresponding Chinese application dated, Dec. 26, 2008; English translation included.
Official Action in corresponding Chinese application dated, Sep. 4, 2009; English translation included.

* cited by examiner

*Primary Examiner* — Viet Pham
(74) *Attorney, Agent, or Firm* — NDQ&M Watchstone LLP

(57) ABSTRACT

A display device includes a plurality of sub-pixels configured to display a plurality of colors including white. Each of the sub-pixels includes a self-luminous element configured to emit light by receiving supply of electric current, an input unit configured to input a luminance signal for determining luminance of the self-luminous element into the sub-pixel, and a control unit configured to control the supply of electric current to the self-luminous element. An area of light emission in each of the sub-pixels for the white is larger than an area of light emission in each of the sub-pixels for the other colors.

14 Claims, 6 Drawing Sheets

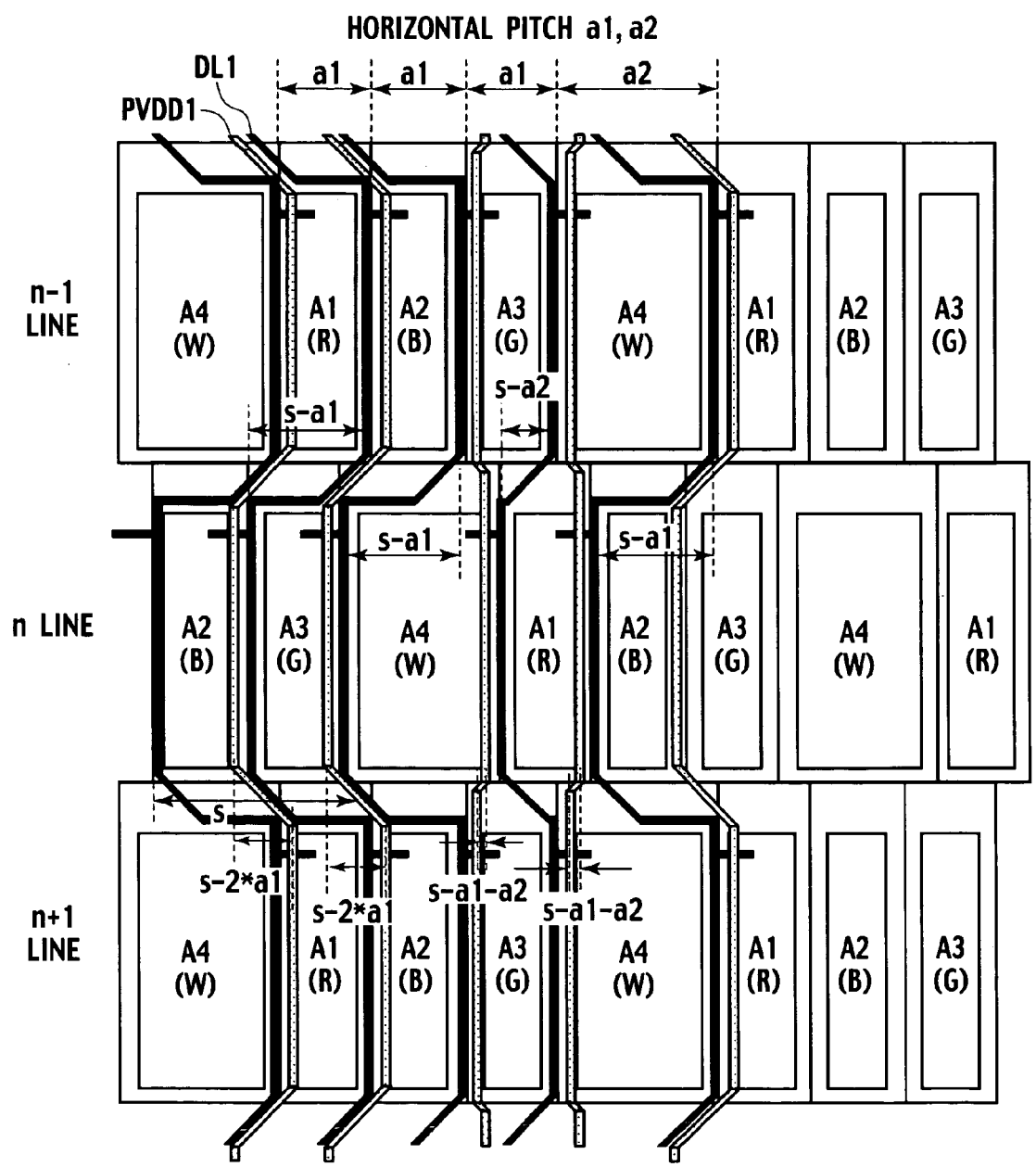

DISPLAY DEVICE

CROSS REFERENCE TO RELATED APPLICATIONS

This application is based upon and claims the benefit of priority from prior Japanese Patent Application P2005-099932 filed on Mar. 30, 2005, and Japanese Patent Application P2005-252699 filed on Aug. 31, 2005; the entire contents of which are incorporated by reference herein.

BACKGROUND OF THE INVENTION

1. Field of the Invention

The present invention relates to a display device and, more particularly, to a display device including plural colors of sub-pixels.

2. Description of the Related Art

These years, development of organic electroluminescence (EL) display devices has been under way. For example, adoption of organic EL display devices for mobile phones has been under consideration. Methods of driving organic EL display devices include a passive matrix driving method and an active matrix driving method. In the case of the passive driving method, scan electrodes and data electrodes are used, and thus pixels are driven by time-division. In the case of the active matrix driving method, thin film transistors (TFTs) are arranged respectively in pixels, and thus light emission of respective pixels is held throughout one vertical scan time period.

In the case of organic EL display devices, it has been known that substantial luminous efficiencies of organic EL elements respectively for colors are different from one color to another, and that life spans of the organic EL elements are dependent on electric current densities applied respectively to the organic EL elements. With regard to organic EL display devices, a larger electric current has to be applied to sub-pixels with a poorer luminous efficiency than that applied to the other sub-pixels with a better luminous efficiency for the purpose of obtaining predetermined luminance in each of the sub-pixels with the poorer luminous efficiency, in a case where all of these sub-pixels have an equal area of light emission. That is because luminous efficiencies of organic EL elements respectively for colors are different from one color to another in the aforementioned manner. This brings about a problem that the elements of the sub-pixels to which the larger electric current is applied become shorter in life span, and another problem that a display device as a whole accordingly becomes shorter in life span.

For the purpose of solving such problems, the following method has been proposed. In the case of this method, areas of light emission in sub-pixels respectively for the colors are different from one color to another depending on luminous efficiencies thereof. Thereby, sub-pixels for any one of the colors have a life span almost equal to those of sub-pixels for the other colors. (See Japanese Patent Laid-open Official Gazette No. 2001-290441, for instance)

In addition, a method of expressing videos by use of four colors of red, green, blue and white has been proposed as a method of reducing power consumption of organic EL display devices (see Japanese Patent Laid-open Official Gazette No. 2004-334204, for instance). Organic EL elements are self-luminous elements. For this reason, organic EL elements start to consume power when the organic EL elements start to emit light. In other words, organic EL display devices display videos by causing individual pixels to emit light. Thus, no sooner do the organic EL display devices start to display a video than the power consumption occurs. For this reason, in the case where videos are expressed by use of the three colors of red, green and blue, electric current is consumed most when white is displayed by emitting the three colors at a time. To put it another way, for the purpose of reducing power consumption, it suffices that sub-pixels for the three colors are designed not to emit light at a time. With this taken into consideration, videos are designed to be displayed by use of four colors which are obtained by adding white to the three colors. Luminous efficiency of a sub-pixel for white is at least more than twice as high as substantial luminous efficiency of each of sub-pixels respectively for red and blue. In addition, white is designed to be displayed by causing sub-pixels for white to emit light. Display of white consumes power most among displays respectively of the four colors. These designs make it possible to check sub-pixels for the three colors from emitting light, and to accordingly reduce power consumption. (see US Patent Published Application No. 20020186214, for instance)

With regard to conventional organic EL display devices each including sub-pixels for the three different colors, several types of circuit layouts have been known. A stripe layout has been known as the most generally-used circuit layout. In the case of the stripe layout, sub-pixels for the colors are arrayed in lines. Scan lines and data lines are provided. The data lines are arranged in a way that the data lines are orthogonal to the scan lines. For the purpose of driving active matrix organic EL display devices with the stripe layout, voltage is applied to the scan lines, and thus sub-pixels are selected. In addition, luminance levels respectively of the sub-pixels are controlled by use of voltage signals which are stored in the data lines.

A delta layout has been known as a second type of circuit layout. In the case of the delta layout, sub-pixels are laid out in triangular patterns instead of in lines. The delta layout makes sub-pixels respectively for the three colors closer to each other than the stripe layout does. For this reason, in many cases, the delta layout provides viewers with more desirable appearance than the stripe layout does. A method of applying such a circuit layout to organic EL display devices including sub-pixels for the four colors has been proposed (see Japanese Patent Laid-open Official Gazette No. 2004-334204, for example).

Particularly in a case where organic EL display devices are applied to mobile phones, it is strongly demanded that power consumption should be reduced. For this reason, the method of expressing videos by use of the four colors of red, green, blue and white, which has been disclosed in Japanese Paten Laid-open Official Gazette No. 2004-334204, is effective for the application of organic EL display devices to mobile phones. However, the present inventors have found that, in a case where a technique disclosed in Japanese Patent Laid-open Official Gazette No. 2001-290441 is applied to organic EL display devices which display videos by use of the four color of red, green, blue and white, the following problem is brought about. The problem is that life spans of sub-pixels are different from one color to another in a case where areas of light emission in sub-pixels respectively for the four colors are made different from one another depending on luminous efficiencies of the sub-pixels by applying the technique.

Furthermore, for the purpose of improving visibility of this type of organic EL display devices using the four colors, consideration needs to be paid lest sub-pixels should be arranged lopsidedly for each color.

With these conditions taken into consideration, the present invention has been made. An object of the present invention is to provide a technique which enables life span of organic EL display devices to be extended. Another object of the present invention is to provide a technique which realizes organic EL display devices with a better visibility.

SUMMARY OF THE INVENTION

An aspect of the present invention inheres in a display device encompassing, a plurality of sub-pixels configured to display a plurality of colors including white, each of the sub-pixels including: a self-luminous element configured to emit light by receiving supply of electric current, an input unit configured to input a luminance signal for determining luminance of the self-luminous element into the sub-pixel, and a control unit configured to control the supply of electric current to the self-luminous element, wherein an area of light emission in each of the sub-pixels for the white is larger than an area of light emission in each of the sub-pixels for the other colors.

Since an area of light emission in each of the sub-pixels for the white, which greatly consume electric current in displaying images, is larger than an area of light emission in each of the sub-pixels for the other colors, it is possible to extend the life span of the display device by smoothing the life span of the elements.

In the display device according to the aspect, the displayed colors may be four colors of blue, green, red, and white. The provision of the white sub-pixel makes it possible to reduce power consumption.

In the display device according to the aspect, a ratio among the sub-pixels for each of the colors in an area of light emission may be set up in accordance with a ratio among substantial electric currents supplied to the self-luminous elements for each of the colors. For example, the ratio among the electric currents may be calculated from averages of electric currents supplied to the self-luminous elements when a plurality of images, such as natural images, are displayed on the display device.

Since a ratio among the sub-pixels for each of the colors in an area of light emission is set up in accordance with a ratio among substantial electric currents supplied to the self-luminous elements for each of the colors, it is possible to appropriately smooth the life span of the elements.

In the display device according to the aspect, a color emitted by the self-luminous element is the white, and the other displayed colors may be obtained by converting the white to the displayed colors except for the white by use of color filters. It is possible to increase yields because step of depositing luminous elements can be simplified. It is possible to increase the resolution because interstices between each neighboring two of the sub-pixels can be narrower.

Another aspect of the present invention inheres in a display device encompassing, a plurality of sub-pixels arranged in horizontal direction, and configured to display a plurality of colors, and to constitute an image component, each of the sub-pixels including: a self-luminous element configured to emit light by receiving supply of electric current, an input unit configured to input a luminance signal for determining luminance of the self-luminous element into the sub-pixel, and a control unit configured to control the supply of electric current to the self-luminous element, wherein at least two sub-pixels of the sub-pixels have an equal horizontal pitch.

In the display device according to another aspect, at least two sub-pixels of the sub-pixels, which are not next to each other, may have an equal horizontal pitch. In the display device according to another aspect, sub-pixels for any one of the colors may be arranged in a way that the sub-pixels for the same color are not next to each other.

Since two sub-pixels of the sub-pixels, which are not next to each other, may have an equal horizontal pitch, for instance a delta layout, it is possible to reduce the number of pixel layout patterns, and to reduce a load imposed on layout design.

Still another aspect of the present invention inheres in a display device encompassing, a plurality of sub-pixels arranged in horizontal direction, and configured to display a plurality of colors, and to constitute an image component, each of the sub-pixels including: a self-luminous element configured to emit light by receiving supply of electric current, an input unit configured to input a luminance signal for determining luminance of the self-luminous element into the sub-pixel, and a control unit configured to control the supply of electric current to the self-luminous element, wherein image components next to each other in vertical direction are arranged in a way that one of the image components shifts from the other of the image components by a distance equal to a half of a horizontal pitch of each of the image components.

BRIEF DESCRIPTION OF THE DRAWINGS

FIG. 9 is a schematic diagram showing a case where the sub-pixels shown in FIG. 5 are arranged in the pixel arrangement of FIG. 1.

DETAILED DESCRIPTION OF THE INVENTION

Figure 1:
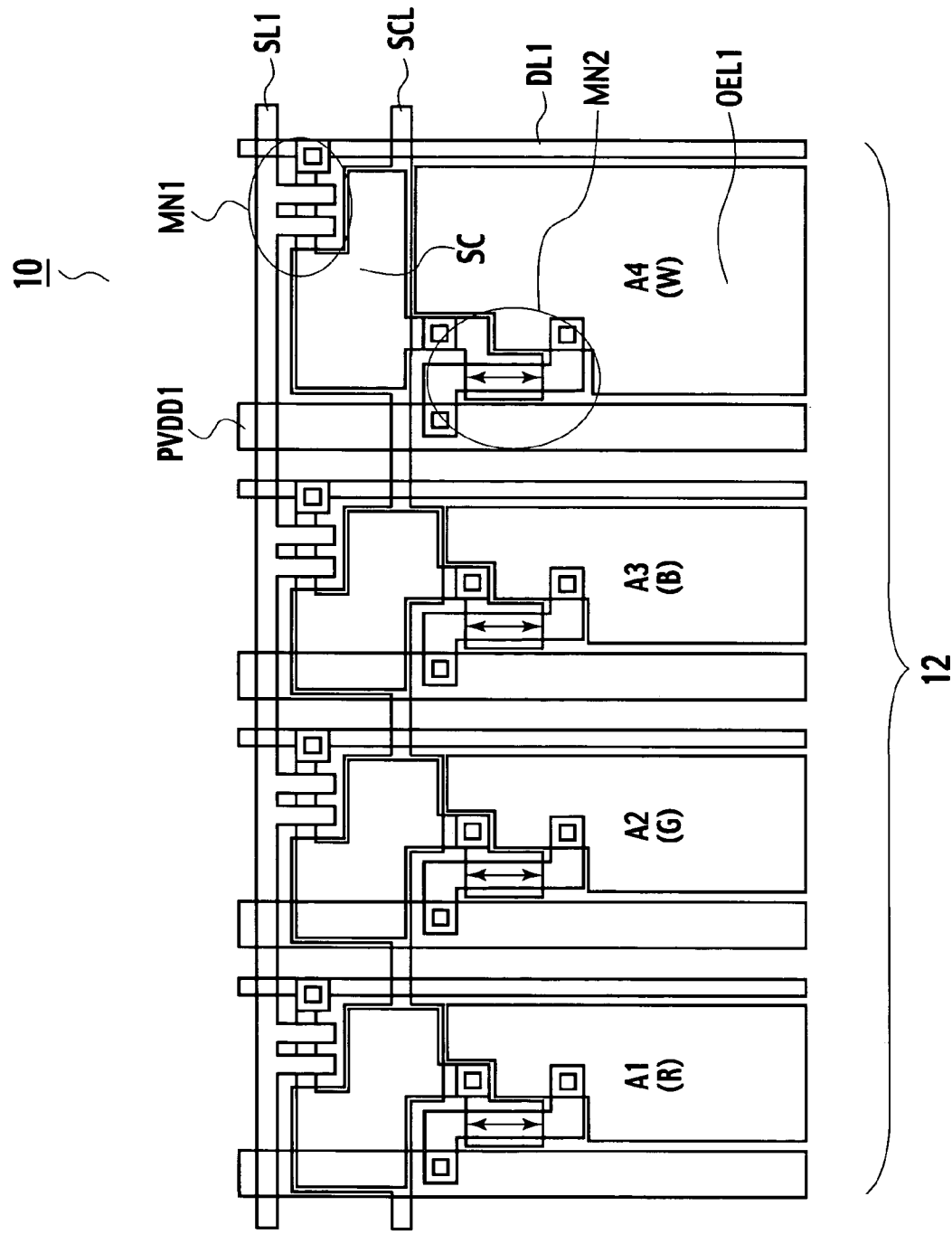
FIG. 1 is a pixel layout diagram showing an organic EL display device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

FIG. 1 shows a pixel layout of an organic EL display device according to a first embodiment of the present invention. As shown in FIG. 1, the organic EL display device 10 according to the first embodiment includes four color sub-pixels: a sub-pixel A1 for red, a sub-pixel A2 for green, a sub-pixel A3 for blue, and a sub-pixel A4 for white. A constitutional unit (pixel) 12 is constituted of the four color sub-pixels A1, A2, A3, and A4 which are arranged side-by-side. When the white sub-pixel A4 is provided to the constitutional (pixel) 12, the lighting of only the white sub-pixel A4 is sufficient for the white color to be displayed, instead of the lighting of all of the red, green, and blue sub-pixels A1, A2, and A3. Accordingly, the provision of the white sub-pixel A4 makes it possible to reduce power consumption.

Figure 2:
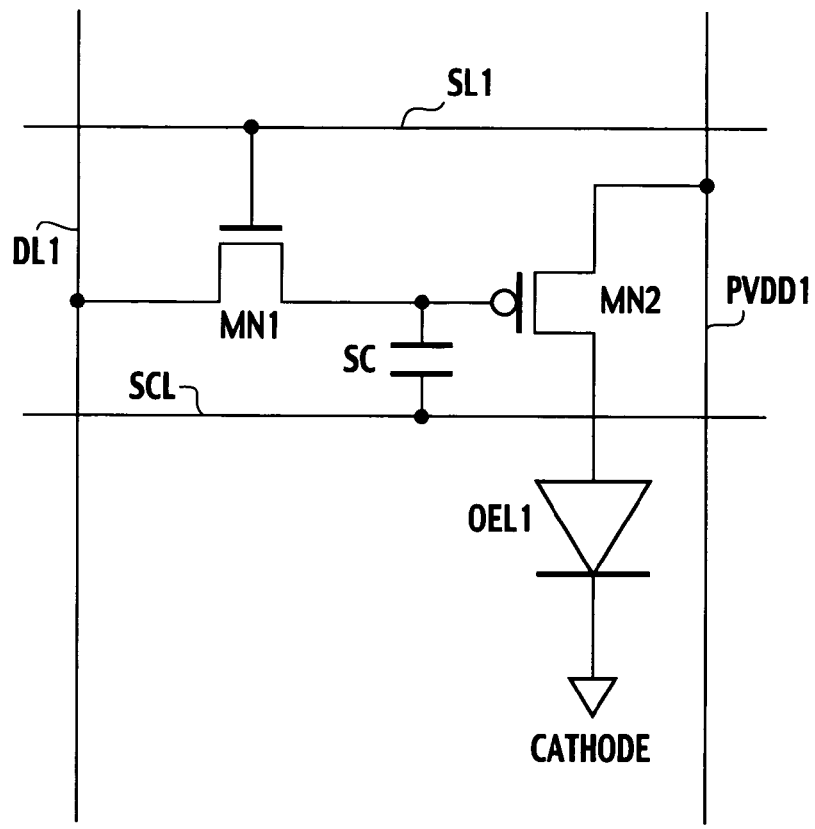
FIG. 2 is a diagram showing an equivalent circuit of any one of sub-pixels in the organic EL display device shown in FIG. 1.

Each of the sub-pixels A1, A2, A3, and A4 is constituted of a power supply line PVDD1, a gate line SL1, a data line DL1, a storage capacitor line SCL, an organic EL element OEL1, a drive transistor MN2, a write transistor MN1, and a storage capacitor SC. The drive transistor MN2 controls supply of electric current to the organic EL element OEL1. The write transistor MN1 is turned to a conductive state in response to application of a selection signal to the gate line SL1, and thus takes a luminance signal for determining luminance of the organic EL element OEL1 into the sub-pixel. The storage capacitor SC is provided in an interstice between a gate electrode of the drive transistor MN2 and the storage capacitor line SCL, and stores data voltage. FIG. 2 is a diagram showing an equivalent circuit of any one of sub-pixels A1, A2, A3 and A4 in the organic EL display device 10 shown in FIG. 1.

Figure 3:
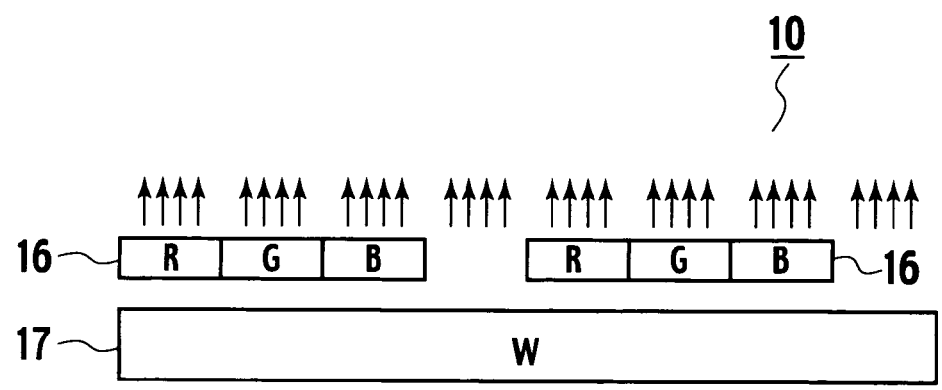
FIG. 3 is a schematic diagram showing a cross section of the organic EL display device according to the first embodiment.

FIG. 3 schematically shows a cross section of the organic EL display device 10 according to the first embodiment. As shown in FIG. 3, the three colors of red, green, and blue are obtained by converting white light from an organic EL luminescent layer 17, which is emitting white, to the colors by use of red, green, and blue color filters 16. The white color is obtained by using white light, which is emitted from the organic EL luminescent layer 17, as it is. The organic EL display device 10 displays a full spectrum of color by use of these four colors. In this regard, the organic EL luminescent layer 17 emitting white is constituted of a laminar structure of a luminescent layer emitting blue and a luminescent layer emitting orange. When the four color sub-pixels are formed of four types of organic EL luminescent layers respectively emitting red, green, blue, and white, interstices between each neighboring two of the sub-pixels have to be set relatively wider while the luminescent layers are being deposited by use of a metal mask. Accordingly, this deteriorates resolution. In addition, when the colors are coated separately, the step of depositing luminous elements has to be multiplied. Accordingly, this decreases yields. In the case of the organic EL display device 10 according to the first embodiment, it suffices that the organic EL luminescent layer 17 is deposited on the entire surface. This makes it possible to preclude the aforementioned problems, and to accordingly improve the resolution and yields.

With regard to the organic EL display device 10 according to the first embodiment, a ratio among maximum electric current values required for their respective colors to be emitted was calculated by use of effective luminous efficiencies and chromaticities of the colors which were measured after white light was transmitted through the color filters 16. At this time, the ratio was red:green:blue:white=1.1:1.3:3.5:1.0. From a simulation conducted by the present inventor, however, it has been found that, in a case where a plurality of arbitrary natural images, such as landscape photos and portraits, were displayed, a ratio among averages of electric currents flowing in the respective organic EL elements OEL1 was red:green:blue:white=1.0:1.1:1.1:2.4. As a result, when a ratio among the four color sub-pixels in luminous area is determined by use of the aforementioned ratio among the maximum electric current values, the current density of the white sub-pixel is highest when an actual video, particularly a natural image, is displayed. This is because the area of the white sub-pixel to consume electric current most among the four color sub-pixels is smallest. In other words, the white sub-pixel is deteriorated in the shortest length of time among the four color sub-pixels. Accordingly, this shortens the life span of the organic EL display device 10 as a whole.

With this taken into consideration, in the case of the organic EL display device 10 according to this embodiment, the luminous area of the white sub-pixel A4 is designed to be the largest among the four color sub-pixels, as shown in FIG. 1. Specifically, a ratio among the four color sub-pixels in area of the opening portion is designed to be red:green:blue:white=1:1:1:2. This ratio makes it possible to reduce the electric current density of the white sub-pixel which consumes electric current most among the four color sub-pixels although the luminous efficiency of the white sub-pixel is the highest among the luminous efficiencies of the four color sub-pixels. Accordingly, this makes it possible to reduce deterioration of the organic EL element OEL1 of the white sub-pixel A4. In other word, this makes it possible to level deterioration speeds of the organic EL elements respectively for the four colors. In addition, this makes it possible to reduce power consumption of the organic EL display device 10.

Second Embodiment

Figure 4:
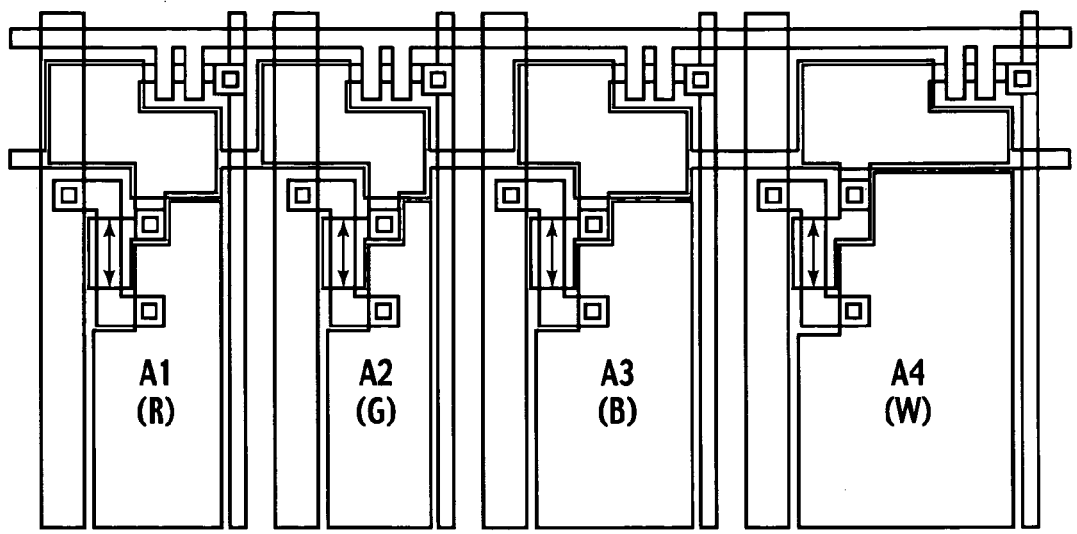
FIG. 4 is a pixel layout diagram showing an organic EL display device according to a second embodiment.

Descriptions will be provided for a second embodiment of the present invention. FIG. 4 is a diagram of a pixel layout of an organic EL display device 10 according to the second embodiment. The pixel layout according to this embodiment is different from the pixel layout according to the first embodiment, which has been shown in FIG. 1, in terms of the ratio among the red, green, blue and white sub-pixels in area of the opening portion. This is because organic EL elements according to this embodiment are different from those according to the first embodiment.

With regard to the organic EL elements OEL1 according to the second embodiment, a ratio among maximum electric current values required for their respective colors to be emitted was calculated by use of effective luminous efficiencies and chromaticities of the colors which were measured after white light was transmitted through the color filters 16. At this time, the ratio was red:green:blue:white=1.4:1.1:1.4:1.0. From a simulation conducted by the present inventors, however, it has been found that, in a case where a plurality of arbitrary natural images, such as landscape photos and portraits, were displayed, a ratio among averages of electric currents flowing in the respective organic EL elements OEL1 was red:green:blue:white=1.0:0.6:1.2:2.3. With this result taken into consideration, in the case of the organic EL display device 10 according to the second embodiment which has been shown in FIG. 4, a ratio among the red, green, blue and white sub-pixels in area of the opening portion is set at 1.0:0.8:1.2:1.7, whereas, in the case of the organic EL display device 10 according to the first embodiment, the ratio among the red, green, blue and white sub-pixels in area of the opening portion is set at 1:1:1:2. In the case of the second embodiment, the white sub-pixel A4 is designed to be the largest in area of the opening portion among the four color sub-pixels as well. Accordingly, this makes it possible to reduce deterioration of the organic EL element OEL1 of the white sub-pixel A4, and to thus extend the life span of the organic EL display device 10.

Third Embodiment

Figure 5:
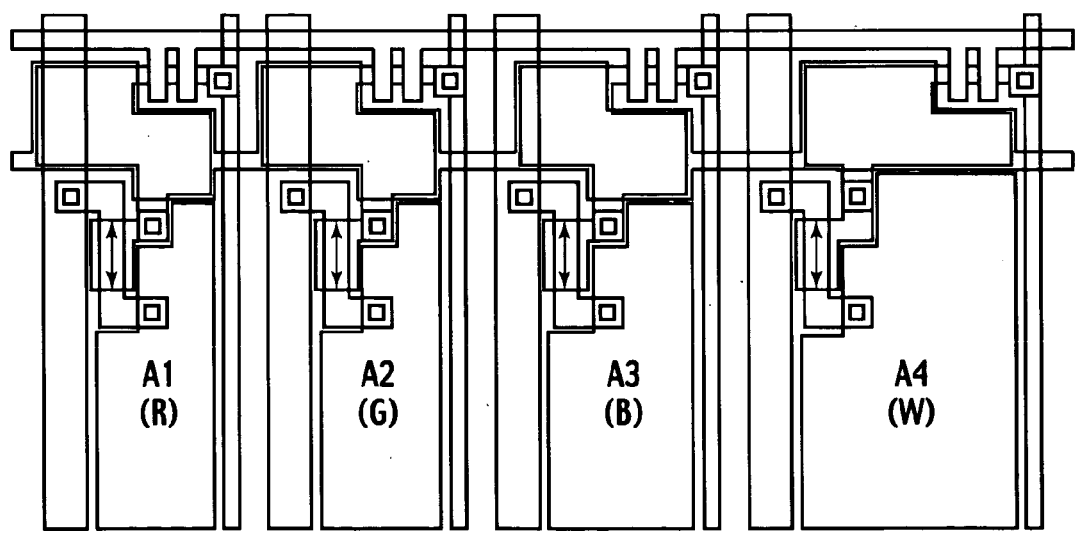
FIG. 5 is a pixel layout diagram showing an organic EL display device according to a third embodiment.

Descriptions will be provided for a third embodiment of the present invention. FIG. 5 is a diagram of a pixel layout of an organic EL display device 10 according to this embodiment. Like the pixel layout according to the second embodiment, the pixel layout according to this embodiment is different from the pixel layout according to the first embodiment in terms of the ratio among the red, green, blue and white sub-pixels in area of the opening portion. This is because organic EL elements according to this embodiment are different from those according to the first embodiment.

With regard to the organic EL display device 10 according to the third embodiment, a ratio among maximum electric current values required for their respective colors to be emitted was calculated by use of effective luminous efficiencies and chromaticities of the colors which were measured after white light was transmitted through the color filters 16. At this time, the ratio was red:green:blue:white=1.1:1.1:1.2:1.0. From a simulation conducted by the present inventors, however, it has been found that, in a case where a plurality of arbitrary natural images, such as landscape photos and portraits, were displayed, a ratio among averages of electric currents flowing in the respective organic EL elements OEL1 was red:green:blue:white=1.0:1.1:1.2:2.4. With this result taken into consideration, in the case of the organic EL display device 10 according to the third embodiment, a ratio among the red, green, blue and white sub-pixels in area of the opening portion is set at 1.0:1.0:1.2:2.0. In this case, the white sub-pixel A4 is designed to be the largest in area of the opening portion among the four color sub-pixels as well. Accordingly, this makes it possible to reduce deterioration of the organic EL element OEL1 of the white sub-pixel A4, and to thus extend the life span of the organic EL display device 10.

As described above, with regard to the first to the third embodiment, irrespective of the types of the organic EL elements OEL1, the maximum electric current value of the white sub-pixel A4 is theoretically the smallest among those of the four color sub-pixels in the case of each of the embodiments. However, the luminous area of the white sub-pixel A4 is designed to be the largest among those of the color sub-pixels in the case of each of the embodiments. In the case of each of the embodiments, such a design makes it possible to reduce the current density of the white sub-pixel A4, and to accordingly reduce deterioration of the organic EL element OEL1 of the white sub-pixel A4, though the white sub-pixel A4 consumes electric current most among the four color sub-pixels in the long run and on the average whereas the white sub-pixel has the high luminous efficiency and the small maximum electric current value. In other words, this makes it possible to extend the life span of the organic EL display device 10 in the case of each of the embodiments. A ratio of the white sub-pixel A4 to each of the other color sub-pixels in area of the opening portion may be determined depending on color distribution in a displayed videos and properties of the materials. It is desirable that the ratio should be not smaller than 1.1:1.0. It is more desirable that the ratio should be not smaller than 2.0:1.0.

Fourth Embodiment

Figure 6:
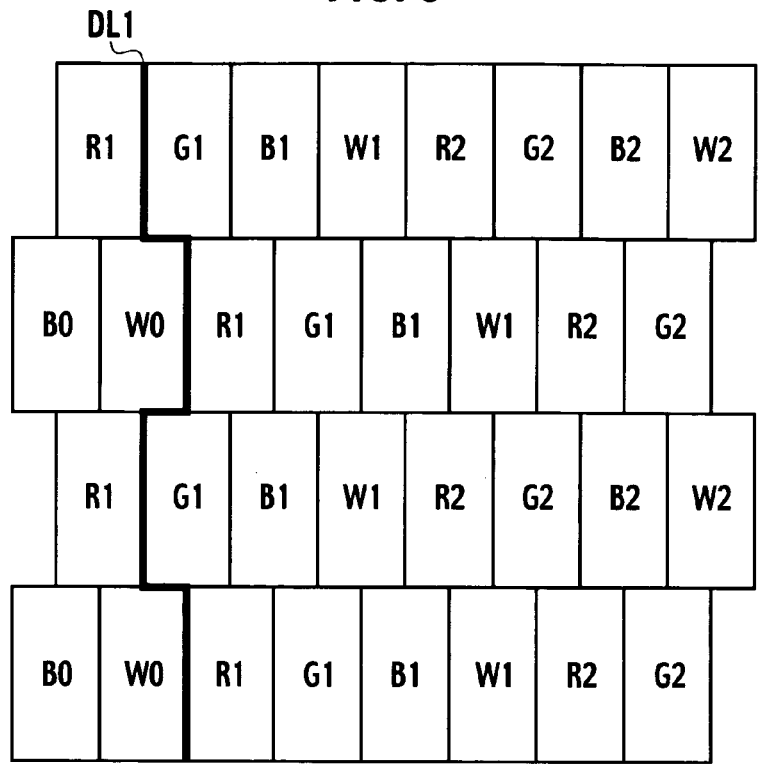
FIG. 6 is a pixel layout diagram showing an example in an active matrix display device.
Figure 7:
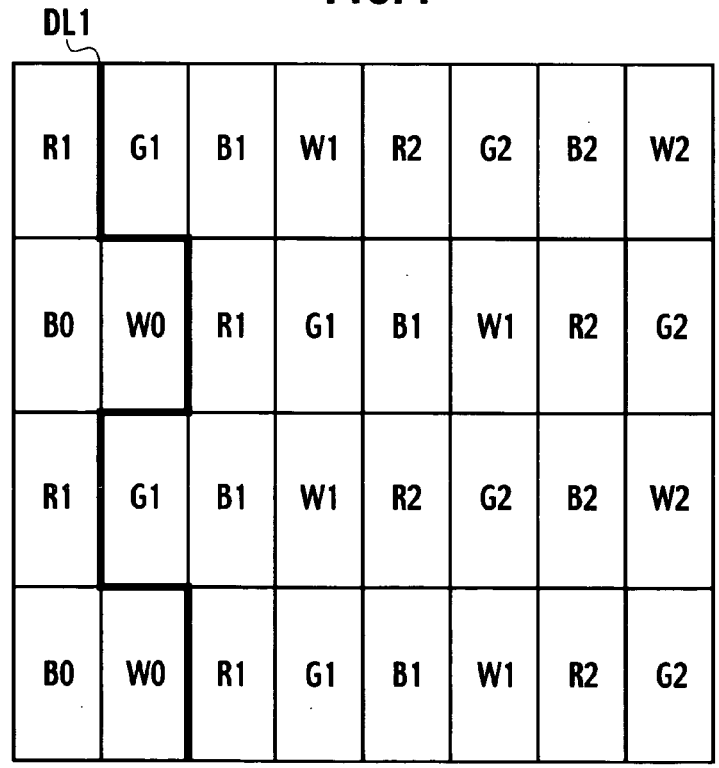
FIG. 7 is a pixel layout diagram showing an example in an active matrix display device.

Descriptions will be provided for a fourth embodiment of the present invention. FIGS. 6 and 7 respectively show examples of a pixel layout in an active matrix display device. In each of the pixel layouts shown in FIGS. 6 and 7, sub-pixels in each two neighboring rows are arranged in a way that sub-pixels for any one color in one row slide away from sub-pixels for the same color in the other row. In the case where videos are intended to be expressed by use of the four colors, not only the pixel layout as shown in FIG. 6 but also the pixel layout as showing FIG. 7 is conceivable. In the case of the pixel layout shown in FIG. 6, sub-pixels for any one color in one of each two neighboring rows slide away from sub-pixels for the same color in the other of the two neighboring rows by a distance 1.5 times the width of each of the sub-pixels. In the case of the pixel layout shown in FIG. 7, sub-pixels for any one color in one of each two neighboring rows slide away from sub-pixels for the same color in the other of the two neighboring rows by a distance twice the width of each of the sub-pixels. In the case of these pixel layouts, sub-pixels for each of the four colors are uniformly distributed and thus arranged. Accordingly, these pixel layouts are advantageous in the case where natural images and moving pictures are intended to be displayed.

In the case of any one of the two layouts, for the purpose of reducing load imposed on external integrated circuits (ICs) for controlling the organic EL display device 10, it is desirable that, as far as sub-pixels for any one color, for example, sub-pixels for red 1 are concerned, a data signal to the sub-pixels should be sent from one data line DL1 shown in FIG. 6 or 7. As a result, the layout needs to be designed in a way that its panel includes a data line DL1 which are bent to a large extent as shown by a bold line in FIG. 6 or 7. This is because, in the case of the pixel layout shown in FIG. 6, sub-pixels for red 1 in any one row slide away from sub-pixels for red 1 in the subsequent row by a distance 1.5 times the width of each of the sub-pixels. In addition, this is because, in the case of the pixel layout shown in FIG. 7, sub-pixels for red 1 in any one row slide away from sub-pixels for red 1 in the subsequent row by a distance twice the width of each of the sub-pixels.

The present inventors have found that, in a case where, out of the four sub-pixels constituting one pixel in each of such pixel layouts, two sub-pixels have the same horizontal pitches, the following contrivance enables a rational layout design. In accordance with this contrivance, sub-pixels arranged in any one row are designed to have layouts, including wires, which are obtained by horizontally reversing layouts of corresponding sub-pixels arranged in the following row. This alternation makes it possible to make a length, in which each data lines DL1 bends when the data line DL1 goes from one row to the subsequent row, equal to a length, in which the data line DL1 bends when the data line DL1 goes from another row to the subsequent row. In addition, this alternation makes it possible to make a length, in which each power supply line PVDD1 bends when the power supply line PVDD1 goes from one row to the subsequent row, equal to a length, in which the power supply line PVDD1 bends when the power supply line PVDD1 goes from another row to the subsequent row.

Figure 8:
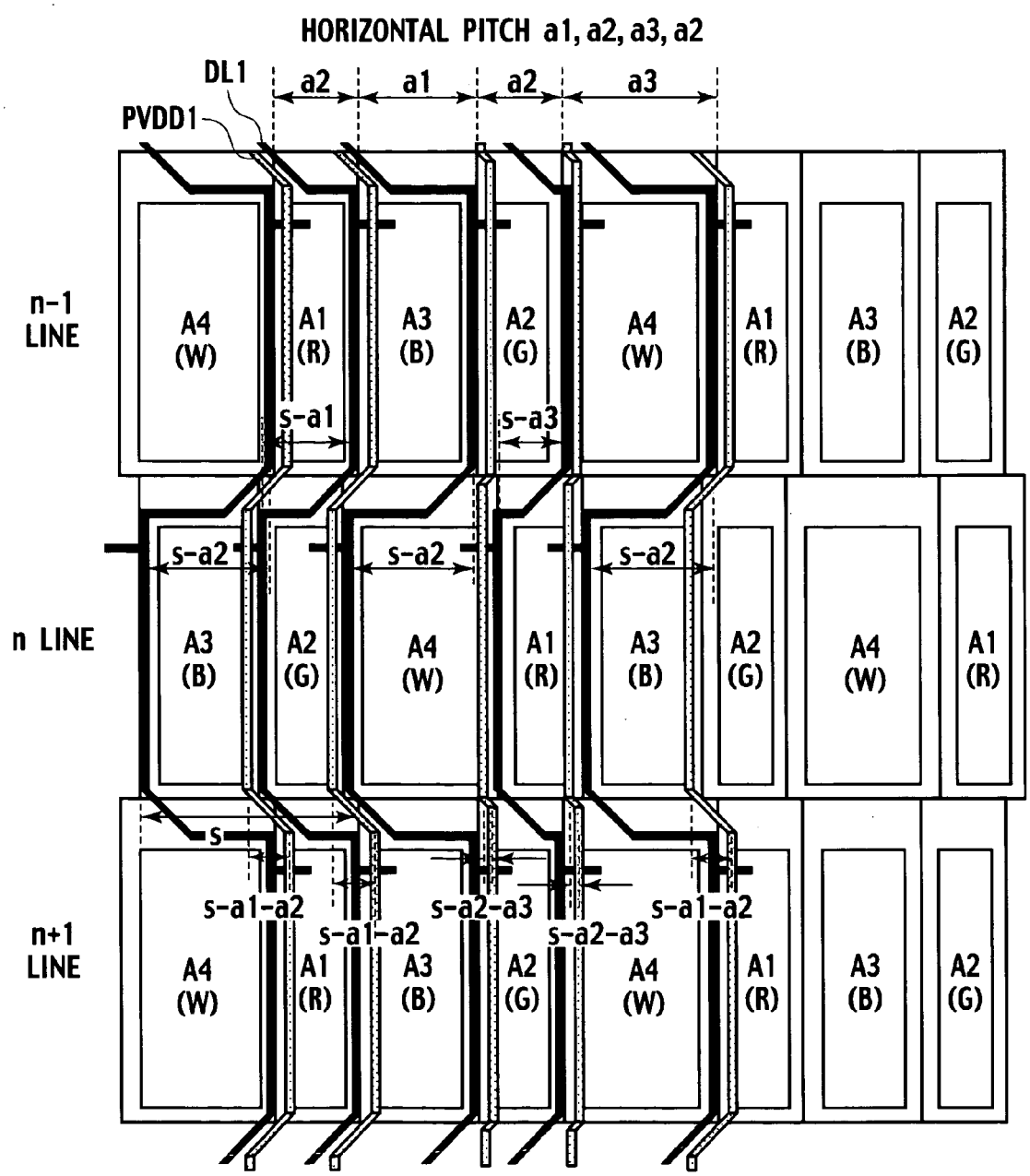
FIG. 8 is a schematic diagram showing a case where the sub-pixels shown in FIG. 5 are arranged in the pixel arrangement of FIG. 7.

Detailed descriptions will be provided for the fourth embodiment of the present invention with reference to the related drawings. FIG. 8 is a schematic diagram showing a case where the sub-pixels with the ratio among the areas of the opening portions thereof according to the third embodiment, which have been shown in FIG. 5, are laid out as shown in FIG. 7. Sub-pixels A1 to A4 shown in FIG. 8 correspond to the sub-pixels A1 to A4 shown in FIG. 5. In FIG. 8, the sub-pixels are laid out in the sequence of a red, blue, green to white sub-pixels. The pixel layout shown in FIG. 8 is different from the pixel layout shown in FIG. 5 in this color sequence.

In FIG. 8, the horizontal pitches of the sub-pixels A1 and A2 are denoted by a2; the horizontal pitch of the sub-pixel A3, a1; and the horizontal pitch of the sub-pixel A4, a3. In addition, an amount of shift of a sub-pixel for one color in one of each two neighboring rows from a sub-pixel for the same color in the other of the two neighboring rows is denoted by s. In this case, with regard to the (n−1)th row, a length in which a data line DL1 bends in a sub-pixel A1 is expressed by s-a2; a length in which a data line DL1 bends in a sub-pixel A3, s-a1; a length in which a data line DL1 bends in a sub-pixel A2, s-a2; and a length in which a data line DL1 bends in a sub-pixel A4, s-a3. Furthermore, with regard to the (n−1)th row, a length in which a power supply line PVDD1 bends in a sub-pixel A1 is expressed by s-a1-a2; a length in which a power supply line PVDD1 bends in a sub-pixel A3, s-a1-a2; a length in which a power supply line PVDD1 bends in a sub-pixel A2, s-a2-a3; and a length in which a power supply line PVDD1 bends in a sub-pixel A4, s-a2-a3. With regard to the nth row, a length in which a data line DL1 bends in a sub-pixel A1 is expressed by s-a2; a length in which a data line DL1 bends in a sub-pixel A3, s-a1; a length in which a data line DL1 bends in a sub-pixel A2, s-a2; and a length in which a data line DL1 bends in a sub-pixel A4, s-a3. Furthermore, with regard to the nth row, a length in which a power supply line PVDD1 bends in a sub-pixel A1 is expressed by s-a2-a3; a length in which a power supply line PVDD1 bends in a sub-pixel A3, s-a1-a2; a length in which a power supply line PVDD1 bends in a sub-pixel A2, s-a1-a2; and a length in which a power supply line PVDD1 bends in a sub-pixel A4, s-a2-a3.

The length in which the data line DL1 bends in the sub-pixel A3 in the (n−1)th row is equal to the length in which the data line DL1 bends in the sub-pixel A3 in the nth row. The length in which the data line DL1 bends in the sub-pixel A4 in the (n−1)th row is equal to the length in which the data line DL1 bends in the sub-pixel A4 in the nth row. The length in which the power supply line PVDD1 bends in the sub-pixel A3 in the (n−1)th row is equal to the length in which the power supply line PVDD1 bends in the sub-pixel A3 in the nth row. The length in which the power supply line PVDD1 bends in the sub-pixel A4 in the (n−1)th row is equal to the length in which the power supply line PVDD1 bends in the sub-pixel A4 in the nth row. For this reason, a pixel layout obtained by horizontally reversing a pixel layout used in the (n−1)th row can be used as the pixel layout for the nth row without any other modification. In contrast, the length in which the power supply line PVDD1 bends in the sub-pixel A1 in the (n−1)th row is different from the length in which the power supply line PVDD1 bends in the sub-pixel A1 in the nth row. In addition, the length in which the power supply line PVDD1 bends in the sub-pixel A2 in the (n−1)th row is different from the length in which the power supply line PVDD1 bends in the sub-pixel A2 in the nth row. However, the pixel layout of the sub-pixel A1 and the pixel layout of the sub-pixel A2 is similar to each other. For this reason, the sub-pixels A1 and A2 can be arranged in the nth row in the following manner: layouts obtained by horizontally reversing the layouts of the sub-pixels A1 in the (n−1)th row can be used as the layouts of the sub-pixels A2 in the nth row, and layouts obtained by horizontally reversing the layouts of the sub-pixels A2 in the (n−1)th row can be used as the layouts of the sub-pixels A1 in the nth row. In other words, when a total of four patterns consisting of one layout pattern for each of the sub-pixels A1, A2, A3 and A4 is prepared, the pixel layout shown in FIG. 9 can be designed as in the case of the pixel layout shown in FIG. 7.

In the case of the layout where the arrangement of the color sub-pixels in one of each two neighboring rows shifts from the arrangement of the color sub-pixels in the other of the two neighboring rows as shown in FIGS. 6 and 7, the number of pixel layout patterns can be held down by satisfying the following two conditions at a time. A first condition is that, out of the four color sub-pixels, at least two color sub-pixels have the same layout. A second condition is that the sub-pixels having the same layout are arranged in a way that the sub-pixels are not next to each other. Holding down the number of pixel layout patterns makes it possible to reduce a load imposed on layout design. This technique can be applied to not only organic EL display devices but also liquid crystal display devices.

Fifth Embodiment

Descriptions will be provided for a fifth embodiment of the present invention. FIG. 9 is a diagram showing a case where sub-pixels with the ratio among the areas of the opening portions thereof according to the first embodiment, which have been shown in FIG. 1, are laid out as shown in FIG. 7. Sub-pixels A1 to A4 shown in FIG. 9 correspond to the sub-pixels A1 to A4 shown in FIG. 1. In FIG. 8, the sub-pixels are laid out in the sequence of a red, blue, green to white sub-pixels. The pixel layout shown in FIG. 9 is different from the pixel layout shown in FIG. 5 in this color sequence.

In FIG. 9, the horizontal pitches of the sub-pixels A1, A2 and A3 are denoted by a1; and the horizontal pitch of the sub-pixel A4, a2. In addition, an amount of shift of a sub-pixel for one color in one of each two neighboring rows from a sub-pixel for the same color in the other of the two neighboring rows is denoted by s. In this case, with regard to the (n−1)th row, a length in which a data line DL1 bends in a sub-pixel A1 is expressed by s-a1; a length in which a data line DL1 bends in a sub-pixel A2, s-a1; a length in which a data line DL1 bends in a sub-pixel A3, s-a1; and a length in which a data line DL1 bends in a sub-pixel A4, s-a2. Furthermore, with regard to the (n−1)th row, a length in which a power supply line PVDD1 bends in a sub-pixel A1 is expressed by s-2*a1; a length in which a power supply line PVDD1 bends in a sub-pixel A2, s-2*a1; a length in which a power supply line PVDD1 bends in a sub-pixel A3, s-a1-a2; and a length in which a power supply line PVDD1 bends in a sub-pixel A4, s-a1-a2. With regard to the nth row, a length in which a data line DL1 bends in a sub-pixel A1 is expressed by s-a1; a length in which a data line DL1 bends in a sub-pixel A2, s-a1; a length in which a data line DL1 bends in a sub-pixel A3, s-a1; and a length in which a data line DL1 bends in a sub-pixel A4, s-a2. Furthermore, with regard to the nth row, a length in which a power supply line PVDD1 bends in a sub-pixel A1 is expressed by s-a1-a2; a length in which a power supply line PVDD1 bends in a sub-pixel A2, s-2*a1; a length in which a power supply line PVDD1 bends in a sub-pixel A3, s-2*a1; and a length in which a power supply line PVDD1 bends in a sub-pixel A4, s-a1-a2.

The length in which the power supply line PVDD1 bends in the sub-pixel A2 in the (n−1)th row is equal to the length in which the power supply line PVDD1 bends in the sub-pixel A2 in the nth row. The length in which the power supply line PVDD1 bends in the sub-pixel A4 in the (n−1)th row is equal to the length in which the power supply line PVDD1 bends in the sub-pixel A4 in the nth row. For this reason, a pixel layout obtained by horizontally reversing a pixel layout used in the (n−1)th row can be used as the pixel layout for the nth row without any other modification. In contrast, the length in which the power supply line PVDD1 bends in the sub-pixel A1 in the (n−1)th row is different from the length in which the power supply line PVDD1 bends in the sub-pixel A1 in the nth row. In addition, the length in which the power supply line PVDD1 bends in the sub-pixel A3 in the (n−1)th row is different from the length in which the power supply line PVDD1 bends in the sub-pixel A3 in the nth row. However, the pixel layout of the sub-pixel A1 and the pixel layout of the sub-pixel A2 is similar to each other. For this reason, the sub-pixels A1 and A3 can be arranged in the nth row in the following manner: layouts obtained by horizontally reversing the layouts of the sub-pixels A1 in the (n−1)th row can be used as the layouts of the sub-pixels A3 in the nth row, and layouts obtained by horizontally reversing the layouts of the sub-pixels A3 in the (n−1)th row can be used as the layouts of the sub-pixels A1 in the nth row. Furthermore, the pixel layouts of the sub-pixels A1, A2 and A3 are similar to one another. A layout for a sub-pixel which causes the power supply line PVDD1 to bend with a length expressed by s-2*a1 can be used commonly for sub-pixels A1, A2 and A3. In other words, when a total of three patterns is prepared for layouts of the sub-pixels A1, A2, A3 and A4, the pixel layout shown in FIG. 9 can be designed as in the case of the pixel layout shown in FIG. 7.

In this manner, the horizontal pitches of two sub-pixels which are not next to each other are equal to each other, even in the case where the horizontal pitches of three sub-pixels are equal to one another as in the case of this embodiment. As a result, the number of pixel layout patterns can be held down, and accordingly a load imposed on layout design can be reduced, as in the case of the fourth embodiment.

It should be noted that, with regard to the pixel layout shown in FIG. 7, sub-pixels for any one color in one of each two neighboring rows slide away from sub-pixels for the same color in the other of the two neighboring rows by a distance two times the width of each of the sub-pixels. In the case where videos are intended to be expressed by use of the four colors, the shift of sub-pixels for the same color between each two neighboring rows by a distance two times the width of each of the sub-pixels means the shift of pixel components between each two neighboring rows by a distance a half times a horizontal pitch of each of the pixel components. This is because each pixel component includes the four sub-pixels. In other words, in the case of the layout shown in FIG. 7, image components next to each other in the vertical direction are laid out in a way that the image components slide from image components next to each other in the vertical direction in the other of the two neighboring rows by a distance a half times a horizontal pitch of each of the image components. Thereby, sub-pixels for each of the four colors are laid out homogeneously in the display screen. In a case where sub-pixels for each of the four colors are laid out inhomogeneously in the display screen, an unsatisfactory condition may take place. Examples of the unsatisfactory condition include a condition in which, when an video expressed with a single color is displayed, the image looks like streaks as a consequence of lighting only sub-pixels for the single color. However, the layout shown in FIG. 7 can reduce occurrence of such an unsatisfactory condition stemming from the layout. That is because sub-pixels for each of the four colors are laid out homogeneously in the display screen. In the case of the pixel layout disclosed in Japanese Patent Laid-open Official Gazette No. 2004-334204, each four color sub-pixels are laid out as a 2×2 matrix, but this type of pixel layout is disadvantageous for displaying moving pictures and the like. That is because only two color sub-pixels are present in the horizontal direction in each 2'2 matrix. In the case of the pixel layout shown in FIG. 7, sub-pixels for each of the four colors are laid out homogeneously in the display screen. Accordingly, this makes it possible to improve visibility of the display device.

Moreover, for the purpose of improving apparent resolution in the horizontal direction, in some cases, original video signals are sampled in timings which are different in sub-pixels from one color to another. In a case where this technique is applied to the pixel layouts shown in FIGS. 6 and 7, clock signals for sampling video signals need to be ready in a way that clock signals used in odd-numbered rows and clock signals used in even-numbered rows are different from each other. In the case of the layout shown in FIG. 7, however, sub-pixels are laid out in a way that the horizontal pitches of image components in any one of the odd-numbered rows slides away from the horizontal pitches of image components in an even-numbered row subsequent to the odd-numbered row by the distance a half times each of the horizontal pitches. For this reason, it suffices that clock signals are generated in a way that phases of clock signals for the odd-numbered rows shift from phases of clock signals for the even-numbered rows by 180°. Thus, one type of clock signals can be easily generated from the other type of clock signals. Accordingly, this makes it easy to design the external driving circuit. In this regard, the layout shown in FIG. 7 is advantageous as well.

Other Embodiments

Various modifications will become possible for those skilled in the art after receiving the teachings of the present disclosure without departing from the scope thereof.

What is claimed is:

1. A display device comprising:
a plurality of sub-pixels each configured to emit a respective color, including four different color components, namely blue, green, red, and white, each sub-pixel including:
a self-luminous element having an electrode that is electrically independent from electrodes of other sub-pixels and that is configured to emit white light or light of another color by receiving a supply of electric current;
an input unit configured to input a luminance signal for determining luminance of the self-luminous element into the sub-pixel; and
a control unit configured to control the supply of electric current to the self-luminous element,
wherein the sub-pixels describe a pixel configured to emit light from each respective sub-pixel in an emission direction, the pixel comprising:
a white sub-pixel, with a self-luminous element that emits white light, and blue, green, and red colored sub-pixels, each with a self-luminous element that emits light of a respective color, arranged in a single row and in a plane normal to the emission direction,
the white sub-pixel has a width and a height and the each of the blue, green and red colored sub-pixels, in the same row, having a width and a height, wherein the height is measured in a direction perpendicular to the width in a plane normal to the emission direction, and
the height of the white sub-pixel being substantially equal to the height of each of the blue, green and red colored sub-pixels, in the same row, the white sub-pixel having a width that is greater than the width of each of the blue, green, and red sub-pixels, in the same row, such that the white sub-pixel has an opening area larger than an opening area of each of the blue, green, and red sub-pixels, in the same row.

2. The display device of claim 1, wherein a ratio among the sub-pixels for each of the colors in region of light emission is set up in accordance with a ratio among substantial electric currents supplied to the self-luminous elements for each of the colors.

3. The display device according to claim 2, wherein the ratio among the electric currents is calculated from averages of electric currents supplied to the self-luminous elements when a plurality of images are displayed on the display device.

4. The display device of claim 1, wherein the self-luminous element is an organic electroluminescent element.

5. The display device of claim 1, wherein the white sub-pixel has an opening area substantially twice as large as an opening area of each of the blue, green, and red sub-pixels, in the same row.

6. The display device of claim 1, wherein the white sub-pixel has an opening area at least twice as large as an opening area of each of the blue, green, and red sub-pixels, in the same row.

7. The display device of claim 1, wherein at least one of the blue, green, and red sub-pixels, in the same row receives light from the white sub-pixel.

8. A display device comprising:
a plurality of sub-pixels each configured to emit a respective color, including white, blue, green, and red, each sub-pixel including:
a self-luminous element having an electrode that is electrically independent from electrodes of other sub-pixels and that is configured to emit white light or light of another color by receiving a supply of electric current;
an input unit configured to input a luminance signal for determining luminance of the self-luminous element into the sub-pixel; and
a control unit configured to control the supply of electric current to the self-luminous element,
wherein the sub-pixels describe a pixel configured to emit light from each respective sub-pixel in an emission direction, the pixel comprising:
a white sub-pixel, with a self-luminous element that emits white light, and blue, green, and red colored sub-pixels, each with a self-luminous element that emits light of a respective color, arranged in a same row and in a plane normal to the emission direction, wherein the white sub-pixel has an opening area larger than an opening area of each of the blue, green and red colored sub-pixels, in the same row, the white sub-pixel having a width that is greater than a width of each of the blue, green, and red sub-pixels, in the same row and the white sub-pixel having a height that is substantially equal to the height of each of the blue, green and red colored sub-pixels.

9. The display device of claim 8, wherein a ratio among the sub-pixels for each of the colors in a region of light emission is set up in accordance with a ratio among substantial electric currents supplied to the self-luminous elements for each of the colors.

10. The display device according to claim 9, wherein the ratio among the electric currents is calculated from averages of electric currents supplied to the self-luminous elements when a plurality of images are displayed on the display device.

11. The display device of claim 8, wherein the self-luminous element is an organic electroluminescent element.

12. The display device of claim 8, wherein the white sub-pixel has an opening area substantially twice as large as an opening area of a respective color sub-pixel.

13. The display device of claim 8, wherein the white sub-pixel has an opening area at least twice as large as an opening area of a respective color sub-pixel.

14. The display device of claim 8, wherein the blue, green and red colored sub-pixels receive light from the white sub-pixel.

* * * * *